(12) United States Patent
Tantoush

(10) Patent No.: US 6,374,905 B1
(45) Date of Patent: Apr. 23, 2002

(54) SCALABLE AND MODULAR HEAT SINK-HEAT PIPE COOLING SYSTEM

(75) Inventor: Mohammad A. Tantoush, Fremont, CA (US)

(73) Assignee: Sun Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/289,300

(22) Filed: Apr. 9, 1999

Related U.S. Application Data

(63) Continuation of application No. 08/885,122, filed on Jun. 30, 1997, now abandoned.

(51) Int. Cl.[7] .................................................. F28F 7/00
(52) U.S. Cl. ................................. 165/80.3; 165/104.33; 165/185; 361/700; 257/715; 174/15.2
(58) Field of Search ....................... 165/104.21, 104.33, 165/80.3, 80.4, 185; 361/700, 690, 710; 257/715, 714; 174/15.2

(56) References Cited

U.S. PATENT DOCUMENTS

| | | |
|---|---|---|
| 4,912,548 A | 3/1990 | Shanker et al. |
| 5,213,153 A | 5/1993 | Itoh |
| 5,268,812 A | 12/1993 | Conte |
| 5,283,715 A | 2/1994 | Carlsten et al. |
| 5,299,090 A | 3/1994 | Brady et al. |
| 5,323,292 A | 6/1994 | Brzezinski |
| 5,329,993 A | 7/1994 | Ettehadieh |
| 5,351,748 A | 10/1994 | Dagan |
| 5,353,193 A | 10/1994 | Chia et al. |
| 5,355,942 A | 10/1994 | Conte |
| 5,375,652 A | 12/1994 | Matsunaga et al. |
| 5,379,830 A | 1/1995 | Itoh |
| 5,396,947 A | 3/1995 | Itoh |
| 5,409,055 A | 4/1995 | Tanaka et al. |
| 5,424,916 A * | 6/1995 | Martin .................... 165/80.4 X |
| 5,471,850 A * | 12/1995 | Cowans ................. 165/80.4 X |
| 5,535,816 A | 7/1996 | Ishida |
| 5,699,853 A | 12/1997 | Goth et al. |
| 5,781,409 A | 7/1998 | Mecredy, III |
| 5,790,376 A * | 8/1998 | Moore .................... 165/80.4 X |
| 5,793,611 A * | 8/1998 | Nakazato et al. ... 165/104.33 X |
| 5,848,637 A * | 12/1998 | Lee ........................ 165/104.21 |

FOREIGN PATENT DOCUMENTS

| | | | |
|---|---|---|---|
| DE | 3825979 | 2/1990 | |
| EP | 0 441 572 | 8/1991 | |
| EP | 0 661 741 | 7/1995 | |
| EP | 0 702 287 | 3/1996 | |
| GB | 1595961 | * 8/1981 | ............ 165/104.33 |
| JP | 59-100394 | 6/1984 | |
| JP | 59-215755 | 12/1984 | |
| JP | 2-110296 | 4/1990 | |
| JP | 03062957 | 3/1991 | |
| JP | 03108747 | 5/1991 | |
| JP | 07263601 | 10/1995 | |

\* cited by examiner

*Primary Examiner*—Christopher Atkinson
(74) *Attorney, Agent, or Firm*—Blakely Sokoloff Taylor & Zafman

(57) ABSTRACT

Modular heat sinks utilizing heat pipes to provide a more uniform temperature distribution over a packaged integrated circuit and efficient heat sinking in either free or forced convection environments. The heat sinks utilize both horizontal and vertical heat pipes to transfer heat both horizontally and vertically in the heat sinks. Selection of the number of heat pipes used allows tailoring of the heat sink capabilities for different applications using the same fundamental assemblage of parts. Various embodiments are disclosed.

16 Claims, 5 Drawing Sheets

US 6,374,905 B1

SCALABLE AND MODULAR HEAT SINK-HEAT PIPE COOLING SYSTEM

This appln is a continuation of Ser. No. 08/885,122 filed Jun. 30, 1997, abandoned.

BACKGROUND OF THE INVENTION

1. Field of the Invention

The present invention relates to the field of heat sinks for semiconductor devices and integrated circuits.

2. Prior Art

Various configurations of heat sinks for semiconductor devices and integrated circuits are well known in the prior art. One common type of heat sink for mounting on the integrated circuit or other semiconductor device comprises a heat sink having projecting fins or legs to increase the surface area of the heat sink for heat dissipation to the surrounding area, either through free convection or forced convection (fan driven) cooling.

In some cases, heat sinks have been configured to somehow snap onto the integrated circuit or other semiconductor device. In such circumstances, the thermal contact between the integrated circuit and the heat sink can be substantially limited, as the actual area of contact between the integrated circuit and the heat sink can be only a small fraction of a potential area for such contact. In such cases, the heat transfer from the integrated circuit to the heat sink may be increased through the use of a thermally conductive grease spanning the air spaces between the heat sink and the packaged integrated circuit. In other cases, the heat sinks have been cemented to the packaged integrated circuits, providing both the mounting and the substantial absence of air spaces between the packaged integrated circuits and the heat sinks.

In the foregoing type of heat sinks, even with very good thermal coupling between the integrated circuit and the heat sink, there frequently is a substantial differential temperature between the integrated circuit and the cooling fins or protrusions on the heat sink, particularly in the larger integrated circuits having a high power dissipation per unit area. Further, integrated circuits having a high power dissipation per unit area tend to run hotter in the center of the integrated circuit than at the edges of the integrated circuit because of the lateral flow of heat away from the edges of the silicon chip. This temperature difference across the chip is undesirable, as even identical transistors operating at different temperatures have different characteristics. The temperature differentials across the chip also mechanically stress the chip, and also allow part of the chip to run hotter than it otherwise would if the temperature was more evenly distributed.

Heat pipes are also well known devices for transferring heat from a warmer location to a cooler location. A typical heat pipe is comprised of an appropriately shaped heat conductive enclosure which has been partially filled with an appropriate liquid. In operation, the liquid in the portion of the heat pipe adjacent the hotter area of the heat pipe absorbs heat and turns to gas, with the gas adjacent the cooler area of the heat pipe condensing back to liquid form to flow back to the hotter area of the heat pipe. Thus, a flow of gas is established from the hotter portion of the heat pipe to the cooler portion of the heat pipe, and a corresponding flow of liquid is established back from the cooler portion of the heat pipe to the hotter portion of the heat pipe. Thus, the heat transfer achieved through the use of the heat pipe is primarily a result of the mass transfer occurring within the heat pipe automatically as a result of the differential temperature between the ends of the heat pipe.

SUMMARY OF THE INVENTION

Modular heat sinks utilizing heat pipes to provide a more uniform temperature distribution over a packaged integrated circuit and efficient heat sinking in either free or forced convection environments. The heat sinks utilize both horizontal and vertical heat pipes to transfer heat both horizontally and vertically in the heat sinks. Selection of the number of heat pipes used allows tailoring of the heat sink capabilities for different applications using the same fundamental assemblage of parts.

One of the important enhancements of this invention is the ability to provide uniform and even heat flux (power density) distribution. This particular functionality reduces high junction temperature in a semiconductor (or any power) device (ASICs, microprocessors, power and laser devices, etc.). This functionality will also enhance and reduce the cooling requirements for these devices because of the heat flux per unit area (i.e., power density) reduction.

The volumetric and surface area heat flux distribution is determined by the number and spacing of these heat pipes in both lateral and axial directions, and the available cooling medium. In most cases, for low power devices, the application of this invention will be sufficient to cool devices by natural convection.

Various embodiments and fabrication techniques are disclosed, including both heat sinks having directional and non directional convection current dependency.

DETAILED DESCRIPTION OF THE PRESENT INVENTION

Figure 1:
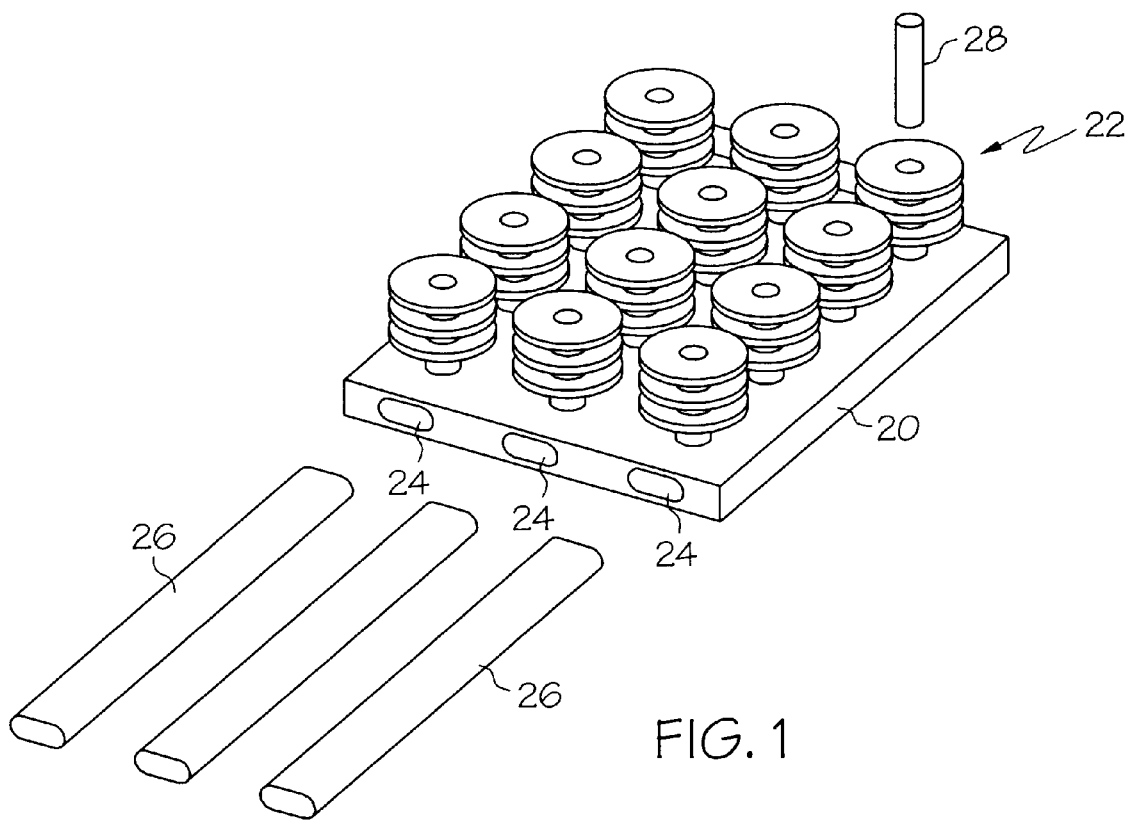
FIG. 1 is an exploded, perspective view of a first embodiment of the present invention.

First referring to FIG. 1, an exploded, perspective view of a first embodiment of the present invention may be seen. The heat sink shown therein is comprised of a substantially planar base member 20 and a plurality of finned, tower-like members, generally indicated by the numeral 22, extending upward therefrom. The base 20 is a plurality of longitudinal openings 24 running lengthwise through the base member within which heat pipes 26 are embedded by any of various methods, such as by an appropriate adhesive such as an epoxy adhesive, by cold or hot pressing, or by welding. Also located within an internal diameter of each of the tower-like protrusions 22 is a small cylindrical heat pipe 28, also preferably secured in position with an appropriate adhesive. The heat pipes in the base and in the tower-like protrusions are elongate heat pipes, with the heat pipes in the tower-like protrusions being substantially perpendicular to the heat pipes in the base.

Figure 2:
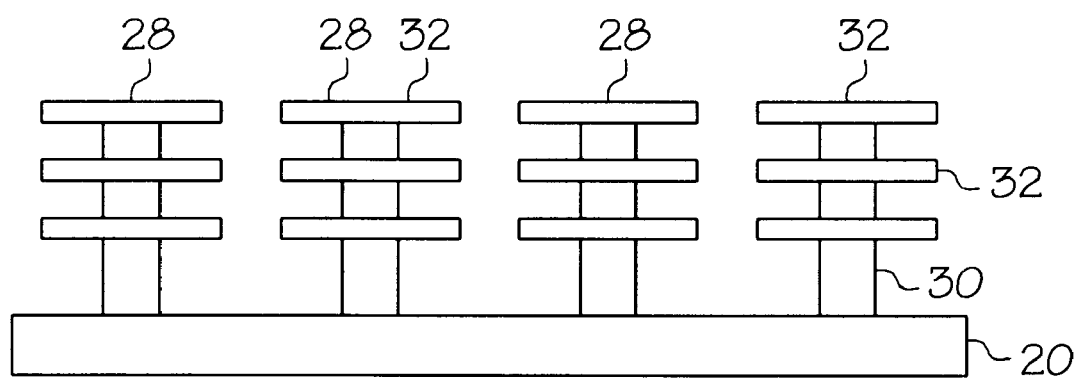
FIGS. 2, 3 and 4 are side, end and top views of the assembly of FIG. 1, respectively.
Figure 3:
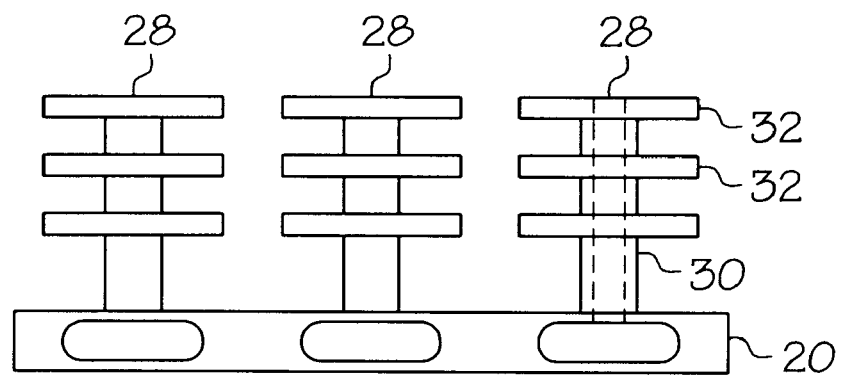
Figure 4:
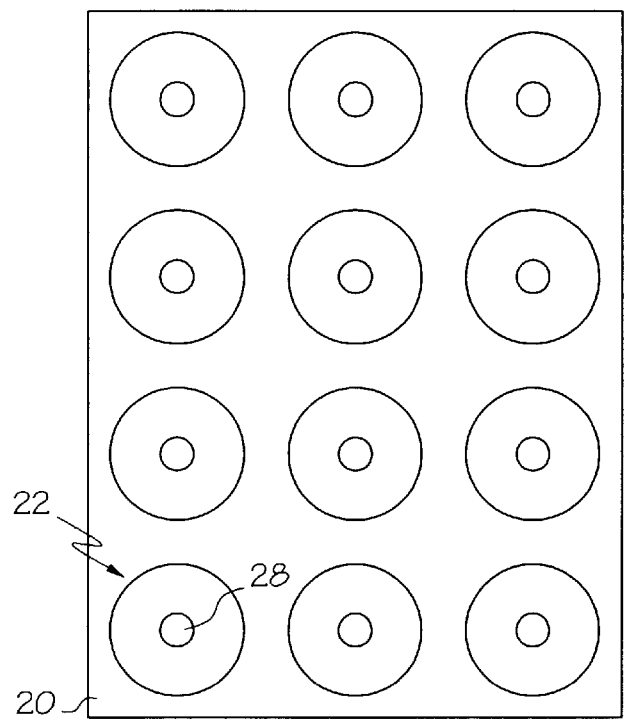

Side, end and top views of the assembly of FIG. 1 may be seen in FIGS. 2, 3 and 4, respectively. As shown in these Figures, the tower-like projections from the top surface of the base 20 are flanged cylindrical members having a cylindrical body 30 and a plurality of fin-like projections 32 thereon. The cylindrical members 30 provide support for the fin-like members 32, yet allow sufficient space there between for convection currents, either free or forced convection, to pass between the cylindrical members, the fin-like projections 32 providing enhanced surface area for maximizing the effectiveness of such convection.

Figure 5:
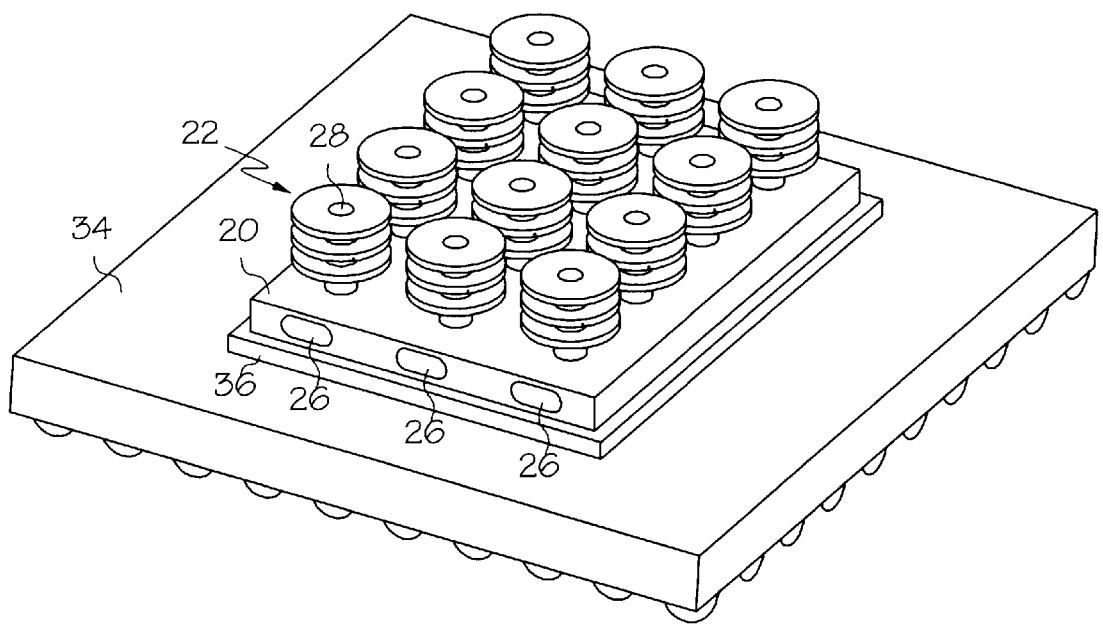
FIG. 5 shows a heat sink in accordance with the present invention cemented to the top surface of a packaged semiconductor device such as a ball grid array (BGA) package.

In operation, the base 20 of the heat sink is cemented 36 to the top surface of the packaged semiconductor device 34, typically but not necessarily a ball grid array (BGA) package, as shown in FIG. 5. Typically, this will be done after functional testing of the system within which heat sinks in accordance with the present invention are used. When so mounted, the horizontal heat pipes 26 will carry heat longitudinally along the base 20 of the heat sink so as to provide a much more uniform temperature distribution across the base of the heat sink. Similarly, the small cylindrical vertical heat pipes 28 will carry heat vertically from the base 20 of the heat sink upward through the tower-like projections 22 for conduction radially outward to the fin-like protrusion 32. Consequently, the heat is very effectively distributed across the area of the heat sink, and upward to the cooling fins for efficient convective cooling thereof.

In the preferred embodiment, the various members making up the assembly other than the heat pipes themselves are preferably made of aluminum, a relatively light metal though quite a good heat conductor itself. The base 20 is preferably an extrusion having the openings 24 (FIG. 1) for the heat pipes 26 directly formed therein. The tower-like protrusions 22 are preferably manufactured from bar stock and secured in holes in the base 20 provided for that purpose.

One of the advantages of the present invention is its modularity. For instance, the heat pipes are readily commercially available, and therefore may be acquired on an as needed basis. The extrusions forming the base of the heat sink may be fabricated either in only a single size or in very few sizes, depending upon the specific needs of various systems within which the present invention may be used, such as in multi-chip modules and high power density and multi-power devices. Similarly, the tower-like projections 22 may be fabricated in bulk and used on an as needed basis. In that regard, note that while twelve such projections are shown in the embodiment of FIGS. 1 through 5, a lesser number could be used for integrated circuits dissipating less power, and a lesser number would be used for smaller heat sinks for smaller integrated circuits. Similarly, a greater number of tower-like projections 22 could be used on larger integrated circuit packages for further enhancement for the cooling thereof. Also, what ever number of cavities for heat pipes are provided in the base member and in the tower-like projections, clearly a lesser number of heat pipes may in fact be used if the full heat sinking potential of the device is not needed.

As a first alternate embodiment, the cylindrical heat pipes 28 (see FIG. 1) could be eliminated if desired. While doing so would reduce the heat sinking capability of the device, such an alternate embodiment would be a lower cost heat sink providing adequate heat sinking capabilities in at least some applications. In such an alternate embodiment, the tower-like projections 22 may have the central hole therein left empty in the interest of commonalty of parts with those embodiments which utilize the heat pipes 28, or alternatively may have the axial region thereof left solid aluminum for enhanced vertical heat conduction.

Figure 6:
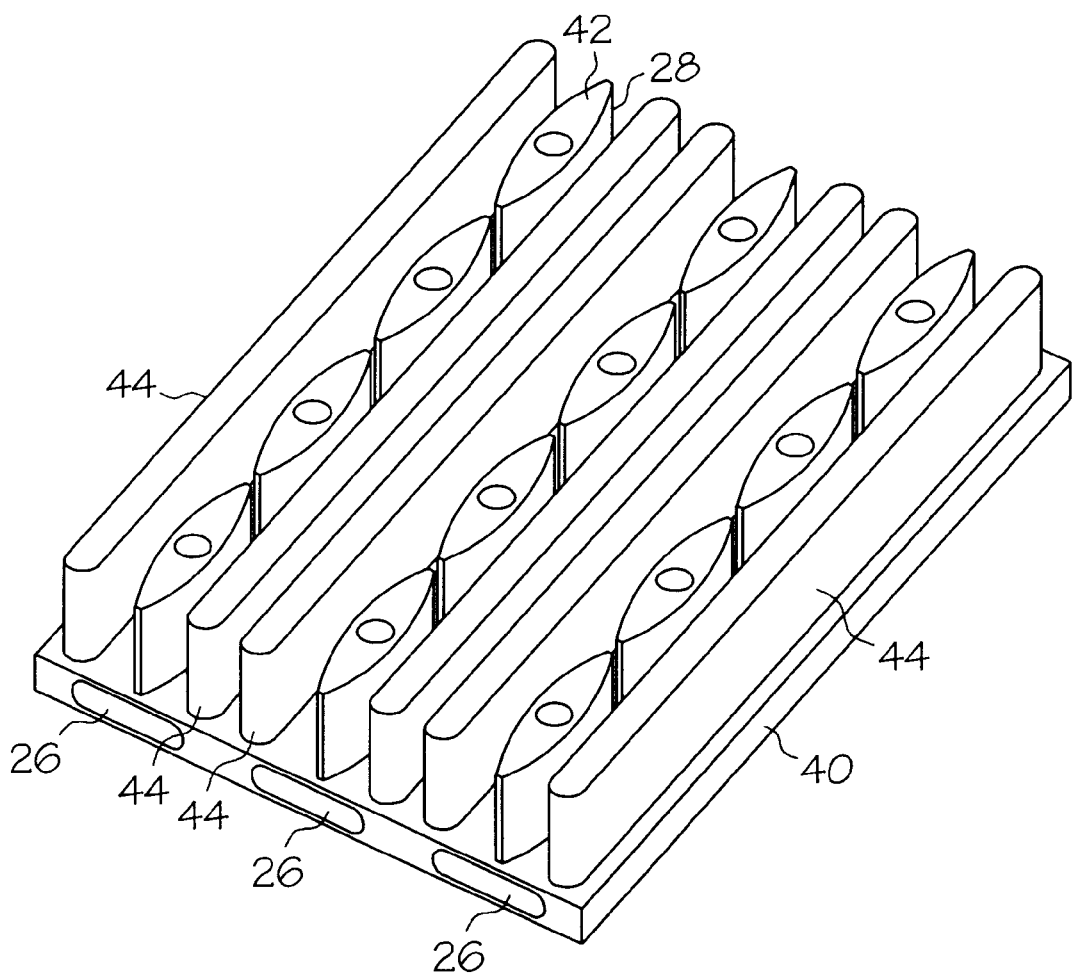
FIG. 6 illustrates a heat sink in accordance with the present invention which is air flow direction dependent.

The embodiments described so far use tower-like projections that are surfaces of revolution, and as such, are in general non-directional, in that air flow may be directed over the heat sink in any horizontal direction. Of course, in a typical system the direction of convection currents, particularly forced convection currents, will be known by design so that the heat sinks in accordance with the present invention may be made direction dependent, provided care is taken to be sure that the same are appropriately aligned with the direction of air flow. Such an embodiment is shown in FIG. 6. Here, as before, a base 40 having heat pipes 26 therein is provided. On the top surface of the base 40 in this embodiment are a plurality of streamlined or approximately air foil shaped projections 42, each of which may have a small cylindrical member heat pipe 28 therein. Projections 42 are disposed on the base 40 in rows separated by one or more air flow control walls 44, which of course also conduct heat upward from base 40 and provide an enhanced surface area for removal of heat by convection.

In the embodiment of FIG. 6, the walls 44 may be extruded integral with base 40, and of course the streamlined members 42 may themselves be extruded and sliced from the extruded bar, or die cast separately. Alternatively, if the openings for the heat pipes 26 extended through the bottom of the base 40, the entire part, excluding heat pipes, might be die castable using a simple two-piece mold, or cold forged using a one-piece die. In any event, the design remains modular, as one can adjust the number of heat pipes used based on the requirement of each specific application.

Figure 7:
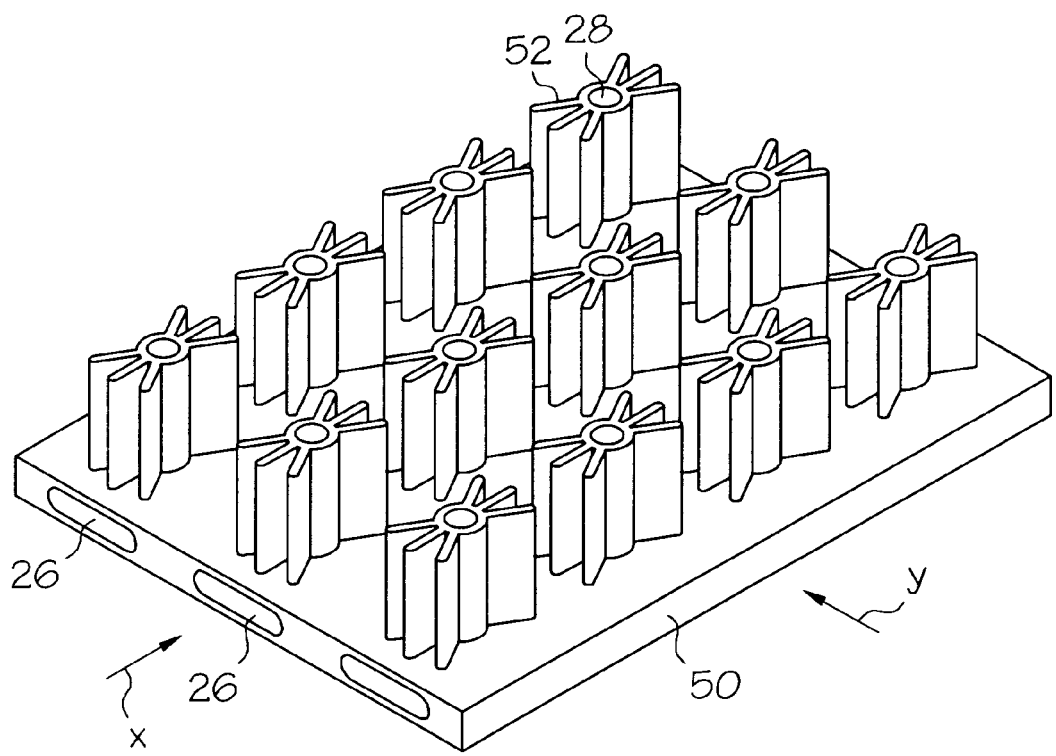
FIG. 7 illustrates a still further embodiment of the present invention which, like that of FIG. 6, is also air flow direction dependent.

Now referring to FIG. 7, a still further embodiment of the present invention may be seen. This embodiment, like that of FIG. 6, is also directional, in that forced convection should be in the x direction for maximum cooling effect and lesser resistance to air flow, or air/liquid cooling impingement, if used. Here, the base 50 containing heat pipes 26 has a plurality of vertical projections 52 which also may be die cast or formed as extrusions and cut to length for mounting on the base 50. As with the prior embodiments, of course, the number of heat pipes used may be varied in accordance with the requirements of any specific application.

The embodiment of FIG. 7 is intended for use in forced convection situations, though is also suitable for use for free convection cooling. In particular, since heated air rises, the fin-like protrusions 52 in FIG. 7 will encourage air flow horizontally into the finned region and then allow the air heated by the fins to rise vertically, drawing in more lateral cooling air. Also like the embodiment of FIG. 6, extending the opening for the horizontal heat pipes through the bottom surface of the base 50 would potentially allow this configuration to be die cast in a single piece like that described with respect to FIG. 6.

There have been described herein heat sinks of a modular character wherein heat sinks of various sinking capabilities may be assembled from common parts, dependent upon the particular requirements of the packaged integrated circuits on which the heat sinks are to be used. One of the important enhancements of this invention is the ability to provide uniform and even heat flux (power density) distribution. This particular functionality reduces high junction temperatures in a semiconductor (or any power) device (ASICs, microprocessors, power and laser devices, etc.). This functionality will also enhance and reduce the cooling requirements for these devices because of the heat flux per unit area (i.e., power density) reduction.

The volumetric and surface area heat flux distribution is determined by the number and spacing of these heat pipes in both lateral and axial directions, and the available cooling medium. In most cases, for low power devices, the application of this invention will be sufficient to cool devices by natural convection.

Thus while the present invention has been disclosed and described with respect to certain preferred embodiments thereof, it will be understood by those skilled in the art that various changes in form and detail may be made therein without departing from the spirit and scope of the invention.

What is claimed is:

1. A heat sink for fastening to an integrated circuit comprising:

a planar base member having an upper surface and an opposing lower mounting surface for fastening to an integrated circuit and receiving heat from the integrated circuit through the lower surface, the planar base member having a first heat pipe embedded therein having a length and width, the length exceeding the width, with the length of the first heat pipe being substantially parallel to the lower surface, the first heat pipe transferring heat across the planar base member to provide a more uniform temperature distribution across the base member;

the planar base member having at least one protrusion projecting from the upper surface, the protrusion having a second heat pipe embedded therein having a length and width, with the length of the second heat pipe being substantially inclined with respect to the mounting surface, the entire second heat pipe being spaced further from the mounting surface than the entire first heat pipe, the first heat pipe and the second heat pipe having intersecting axes, the second heat pipe being thermally coupled to the first heat pipe and transferring heat within the protrusion.

2. The heat sink of claim 1 further comprising a plurality of first and second elongate heat pipes, wherein the base member has the plurality of the first elongate heat pipes therein with the length of the first elongate heat pipes being substantially parallel to the mounting surface;

the planar base member having a plurality of protrusions projecting therefrom, the protrusions each having one of the second elongate heat pipes therein with the length of each of the second elongate heat pipes being substantially perpendicular to the mounting surface.

3. The heat sink of claim 2 wherein the protrusions are in the shape of surfaces of revolution.

4. The heat sink of claim 2 wherein the protrusions are each unsymmetrical, providing a preferred direction of air flow for convection cooling.

5. A heat sink comprising:

a planar base member having an upper surface and an opposing lower surface to be thermally coupled to a planar surface of a heat source;

a tower-like member having a first end, and an opposing second end, the tower-like member affixed to the upper surface of the planar base member at the first end, the tower-like member having a first axis connecting the first end and the second end that is substantially inclined to the planar surface;

a first heat pipe having a first generally cylindrical surface with a second axis, the first heat pipe embedded in the tower-like member, the second axis generally parallel to the first axis;

a second heat pipe having a second generally cylindrical surface with a third axis, the second heat pipe embedded in the planar base member, the third axis generally parallel to the planar surface and intersecting the second axis, the second heat pipe located between the planar surface and the first heat pipe, the second heat pipe thermally coupled to the planar base member and to the first heat pipe.

6. The heat sink of claim 5 where in the tower-like member further comprises a cylindrical body and a plurality of fin-like projections affixed to the cylindrical body.

7. The heat sink of claim 5 wherein the tower-like member is air foil shaped.

8. The heat sink of claim 5 wherein the planar base member further comprises a first plurality of cavities that are selectively populated by a second plurality of tower-like members to provide a predetermined power dissipation.

9. The heat sink of claim 5 further comprising a first plurality of tower-like members that are selectively populated by a second plurality of embedded heat pipes to provide a predetermined power dissipation.

10. The heat sink of claim 5 wherein the heat source is an integrated circuit.

11. The heat sink of claim 5 wherein the first axis is substantially perpendicular to the planar surface.

12. An integrated circuit in a package with a substantially planar surface, the integrated circuit comprising a heat sink, the heat sink including:

a planar base member having an upper surface and an opposing lower surface affixed and thermally coupled to the planar surface of the integrated circuit;

a plurality of tower-like members each having a first end, and an opposing second end, each tower-like member affixed to the upper surface of the planar base member at the first end, each tower-like member having a first axis connecting the first end and the second end that is substantially inclined to the planar surface of the integrated circuit;

a plurality of first heat pipes each having a first generally cylindrical surface with a second axis, each first heat pipe embedded in one of the tower-like members, the second axis generally parallel to the first axis;

a second heat pipe having a second generally cylindrical surface with a third axis, the second heat pipe embedded in the planar base member, the third axis generally parallel to the planar surface and intersecting the second axes, the second heat pipe located between the planar surface and the plurality of first heat pipes, the second heat pipe thermally coupled to the planar base member and to the plurality of first heat pipes.

13. The integrated circuit of claim 12 wherein each tower-like member further comprises a cylindrical body and a plurality of fin-like projections affixed to the cylindrical body.

14. The integrated circuit of claim 12 wherein each tower-like member is air foil shaped.

15. The integrated circuit of claim 12 wherein the planar base member further comprises a first plurality of cavities that are selectively populated by a second plurality of tower-like members to provide a predetermined power dissipation.

16. The integrated circuit of claim 12 wherein a first plurality of tower-like members are selectively populated by a second plurality of embedded heat pipes to provide a predetermined power dissipation.

* * * * *